(12) United States Patent
Carvalho

(10) Patent No.: US 8,717,004 B2
(45) Date of Patent: May 6, 2014

(54) CIRCUIT COMPRISING TRANSISTORS THAT HAVE DIFFERENT THRESHOLD VOLTAGE VALUES

(75) Inventor: Carlos Carvalho, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 116 days.

(21) Appl. No.: 13/173,083

(22) Filed: Jun. 30, 2011

(65) Prior Publication Data

US 2013/0002351 A1    Jan. 3, 2013

(51) Int. Cl.
*G05F 3/16* (2006.01)

(52) U.S. Cl.
USPC ........................................... 323/316

(58) Field of Classification Search
USPC ............................ 323/281, 313, 314, 315, 316
See application file for complete search history.

(56) References Cited

U.S. PATENT DOCUMENTS

| | | | | |
|---|---|---|---|---|
| 5,945,821 A * | 8/1999 | Sakurai et al. | ................ | 323/313 |
| 6,462,526 B1 * | 10/2002 | Tanase | ........................ | 323/313 |
| 6,529,066 B1 * | 3/2003 | Guenot et al. | ................ | 327/539 |
| 6,710,642 B1 * | 3/2004 | Tang et al. | ..................... | 327/539 |
| 6,777,920 B2 * | 8/2004 | Furutani et al. | ............... | 323/280 |
| 7,256,643 B2 * | 8/2007 | Pan et al. | ....................... | 323/313 |
| 7,382,179 B2 * | 6/2008 | Geller | ........................... | 327/538 |
| 2003/0020445 A1 * | 1/2003 | Kamenicky | ................... | 323/315 |
| 2009/0051342 A1 * | 2/2009 | Peng et al. | .................... | 323/313 |
| 2009/0267585 A1 * | 10/2009 | Liu et al. | ........................ | 323/313 |
| 2010/0181978 A1 * | 7/2010 | Kawagoshi | ................... | 323/282 |
| 2011/0074508 A1 * | 3/2011 | Imura | ........................... | 330/253 |

* cited by examiner

*Primary Examiner* — Gary L Laxton
*Assistant Examiner* — Alex Torres-Rivera
(74) *Attorney, Agent, or Firm* — Lowe Hauptman & Ham, LLP

(57) ABSTRACT

A circuit comprises a first amplifier and a second amplifier. The first amplifier is configured to amplify a first voltage difference between a first voltage and a second voltage, and to generate a third voltage. The second amplifier is configured to amplify a second voltage difference between the third voltage and an input voltage, and to generate an output voltage. The first voltage is a voltage at a first terminal of a first transistor. The second voltage is a voltage at a second terminal of a second transistor. A first gate of the first transistor is adapted to receive the third voltage. A second gate of the second transistor is adapted to receive the input voltage. Threshold voltage values of the first transistor and the second transistor differ.

20 Claims, 5 Drawing Sheets

CIRCUIT COMPRISING TRANSISTORS THAT HAVE DIFFERENT THRESHOLD VOLTAGE VALUES

FIELD

The present disclosure is related to a voltage that is independent of manufacturing process, operational voltage, and temperature variations.

BACKGROUND

Reference voltages in integrated circuits (ICs) are traditionally provided by a bandgap generator, which, in some approaches, has about 3% inaccuracy. For a supply voltage of about 0.9 V or less, the bandgap generator approach is not viable because a voltage used to generate the reference voltage can be greater than about 0.8 V, leaving little room for the reference voltage to be generated.

In various conditions, reference voltages based on the operation of a metal oxide silicon field effect transistor (MOSFET) in the sub-threshold region result in inaccuracy due to process variations, especially when a polysilicon resistor is involved.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
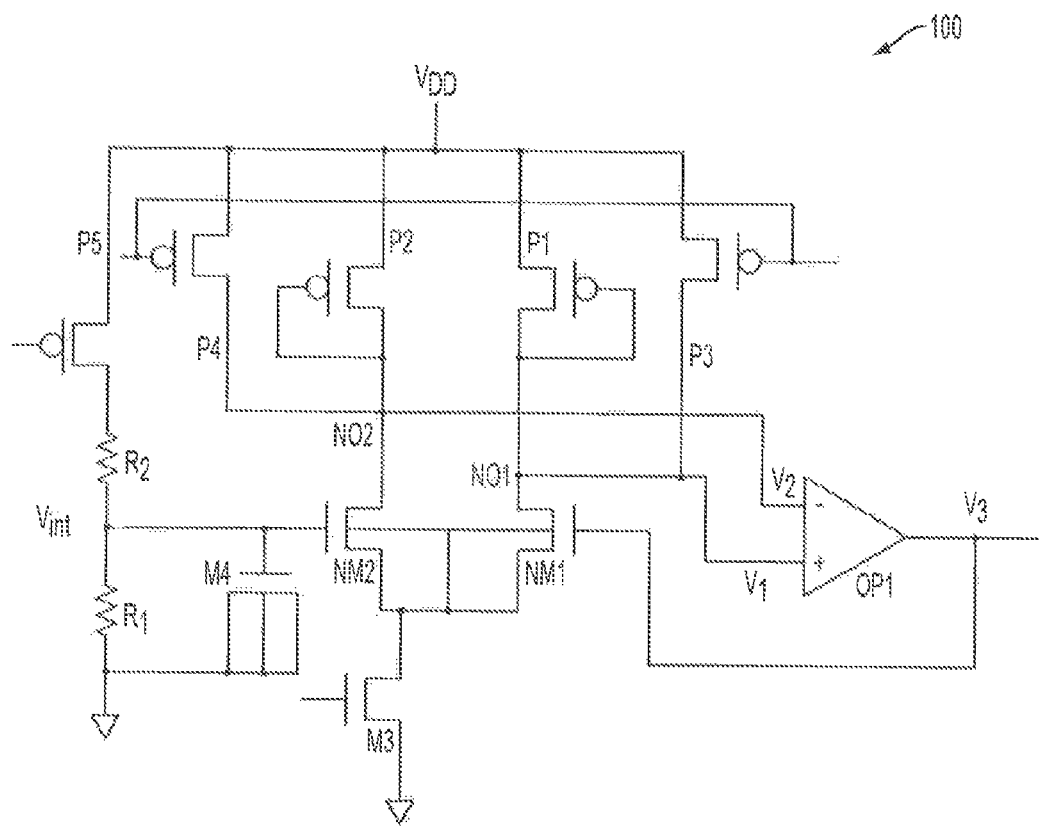
FIG. 1 is a diagram of a circuit used with the circuit in FIG. 3 to generate a voltage, in accordance with a first embodiment.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Various embodiments include one or a combination of the following features and/or advantages. The generated voltage is independent of manufacturing process, operational voltage and temperature (PVT) variations, and is used as a reference voltage. As a result, the reference voltage can be used in integrated circuits that use low supply voltage, e.g., of about 0.8 V.

Exemplary Circuit

FIG. 1 is a diagram of a circuit 100, in accordance with some embodiments.

NMOS transistors NM1 and NM2 form a differential pair. In some embodiments, the bulks and the sources of transistors NM1 and NM2 are coupled together so that the voltage VBS (not labeled) dropped across the bulk and the source of each transistor NM1 or NM2 is zero. As a result, each of threshold voltages Vtnm1 (not labeled) and Vtnm2 (not labeled) of the respective transistors NM1 and NM2 is independent of the body effect with respect to temperature changes.

In some embodiments, the voltage values of threshold voltage Vtnm1 and of threshold voltage Vtnm2 differ. Generally, there are different types of transistors having different threshold voltage values, even though the transistors may have the same sizes and/or be manufactured by similar processes. For example, a "regular" transistor has a regular threshold voltage value. A high-Vt transistor has a threshold voltage value higher than the threshold voltage value of a regular transistor. In contrast, a low-Vt transistor has a threshold voltage value lower than the threshold voltage value of the regular transistor. Typically, a transistor having a higher threshold voltage value switches slower and has a lower leakage current. A transistor having a lower threshold voltage value, however, switches faster but has a higher leakage current.

For illustration purposes, with respect to FIG. 1, threshold voltage Vtnm1 is lower than threshold voltage Vtnm2. Further, threshold voltage Vtnm2 is of a regular transistor NM2 while threshold voltage Vtnm1 is of a low-voltage transistor NM1. Additionally, voltage ΔVtn is the voltage difference between threshold voltage values Vtnm1 and Vtnm2. Mathematically stated:

$$\Delta Vtn = Vtnm2 - Vtnm1$$

Each of PMOS transistors P1 and P2 is connected as a diode and functions as a load for the differential pair constituted by transistors NM1 and NM2. PMOS transistors P1 and P2 are coupled to the drains of respective transistors NM1 and NM2 at the respective nodes NO1 and NO2. Other circuits serving as a load are within the scope of various embodiments. Examples of those circuits include a resistor, a PNP bipolar transistor.

PMOS transistors P3 and P4 function as a power down circuit. For example, if transistors P3 and P4 are on, the respective nodes NO1 and NO2 are pulled to operational voltage VDD of respective transistors P3 and P4. In effect, the circuitry coupled to nodes NO1 and NO2 and input to amplifier OP1 is disabled.

PMOS transistor P5 also functions as a power down circuit. For example, when transistor P5 is turned on, resistor R2 is electrically coupled to operational voltage VDD of transistor P5. When transistor P5 is turned off, however, transistor P5 acts as an open circuit, and voltage Vint is electrically disconnected from voltage VDD. As a result, there is no voltage source for voltage Vint.

Resistors R2 and R1 function as a voltage divider, dividing the voltage at the drain of PMOS transistor P5 to result in voltage Vint. In some embodiments, the voltage at the drain of PMOS transistor P5 is at about the operational voltage VDD of transistor P5 when transistor P5 is on. As a result, $$Vint = VDD*(R1/(R1+R2))$$

NMOS transistor M4 is configured as an NMOS capacitor to filter noise at voltage VDD or at voltage Vint.

NMOS transistor M3 functions as a current source and serves as a current path for the differential pair of transistors NM1 and NM2. Other current sources and circuits serving as a current path are within the scope of various embodiments. A resistor is an example of a circuit serving as a current path.

Voltages V1 and V2 at respective nodes NO1 and NO2 are fed to the positive and negative terminals of amplifier OP1, respectively. Amplifier ON generates voltage V3 at the output of amplifier OP1 based on voltages V1 and V2. In some embodiments, voltage V1 at node NO1 and voltage V2 at node NO2 are equal based on the operation of amplifier OP1.

Figure 2:
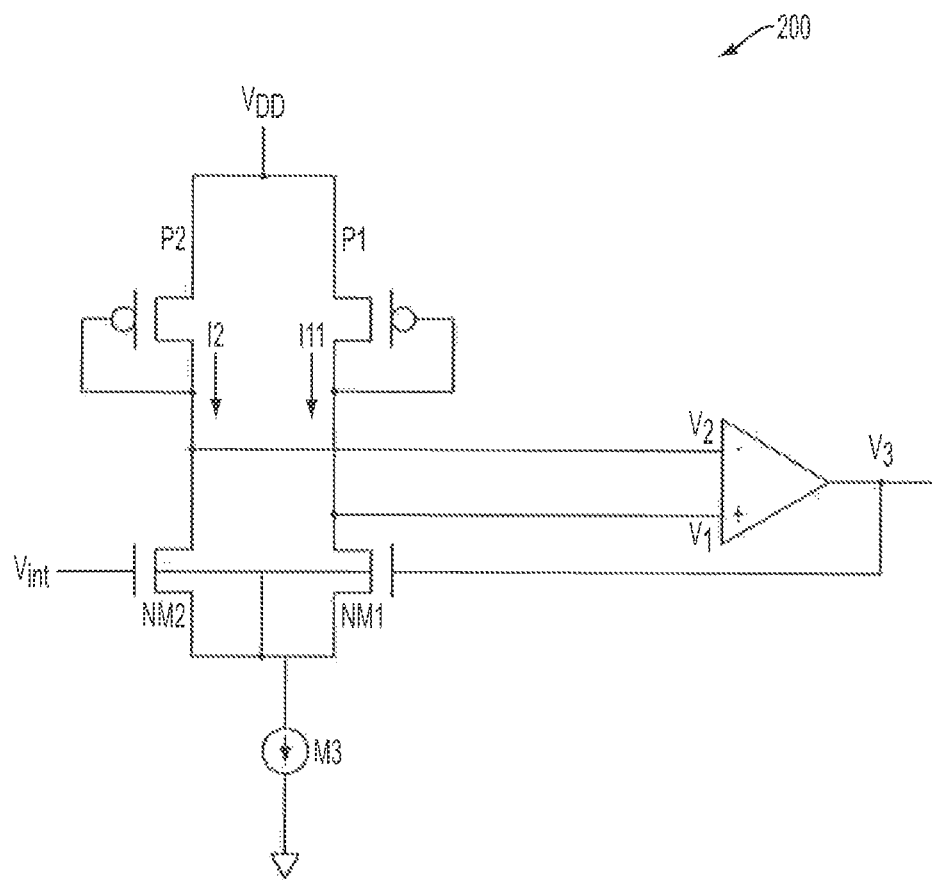
FIG. 2 is a diagram of the circuit in FIG. 1 with various elements not shown to illustrate the operation of the circuit in FIG. 1.

FIG. 2 is a diagram of a circuit 200, illustrating circuit 100 in operation, in accordance with some embodiments. Circuit 200 is circuit 100 with various elements not shown. For example, in circuit 200, transistor P3, transistor P4, transistor P5, transistor N5 in circuit 100 are not shown.

In some embodiments, based on the operation of amplifier OP1:

$$V3 = Vint + \Delta Vtn$$

In other words, using voltage Vint as a base voltage, voltage V3 rises to a voltage value of $\Delta Vtn$ so that current I1 equals current I2 such that voltage V1 equals to voltage V2.

Figure 3:
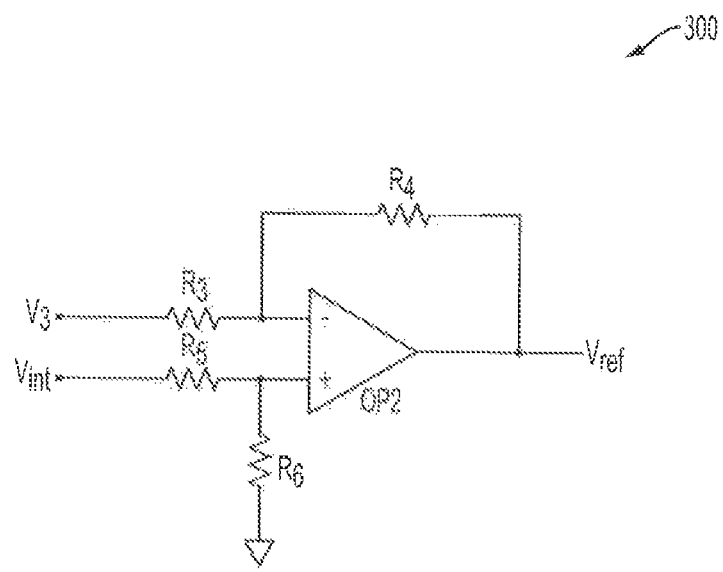
FIG. 3 is a diagram of a circuit used in conjunction with the circuit in FIG. 1 to generate a voltage, in accordance with some embodiments.

FIG. 3 is a diagram of a circuit 300, illustrating how voltage Vref is generated, in accordance with some embodiments. In some embodiments, voltage Vref is used as reference voltage for other voltages to be generated in an embedded dynamic random access memory (eDRAM). Voltage Vref used for other purposes are within the scope of various embodiments. Amplifier OP2 receives voltage Vint in FIG. 2 at the positive terminal through resistor R5, and receives voltage V3 at the negative terminal through resistor R3. Resistor R4 is coupled between the negative input and the output of amplifier OP2. Resistor R6 is coupled between the positive input and ground.

Based on the operation of amplifier OP2:

$$Vref = (R4/R3) * (V3 - Vint) \text{ or} \quad (1)$$
$$= (R4/R3) * ((Vint + \Delta Vtn) - Vint) \text{ or}$$
$$= (R4/R3) * \Delta Vtn$$

With reference to equation (1), voltage $\Delta Vtn$ or voltage Vtnm2−voltage Vtnm1 is independent of PVT variations. For example, for any change in voltage Vtnm1 due to one or a combination of variations in manufacturing process (P), operational voltage VDD (V), and temperature (T), there is a corresponding change in voltage Vtnm2. As a result, the change in voltage Vtnm1 is canceled by the change in voltage Vtnm2. In other words, voltage Vtnm2−voltage Vtnm1 is independent of PVT variations. With respect to the resistance ratio R4/R3, voltage Vref is also independent of variations in fabricating resistors R3 and R4 because a variation in one resistor is canceled by a variation in the other resistor. As a result, voltage Vref is independent of the resistor variations. Consequently, voltage Vref is independent of PVT variations, which is advantageous over other approaches.

In some embodiments, (R4/R3)=(R6/R5), $\Delta Vtn$ is about 150 mV, and voltage Vref is about 680 mV. As a result:

$$(R4/R3) = (Vref/\Delta Vtn) = 680/150 \sim 4.3$$

Figure 4:
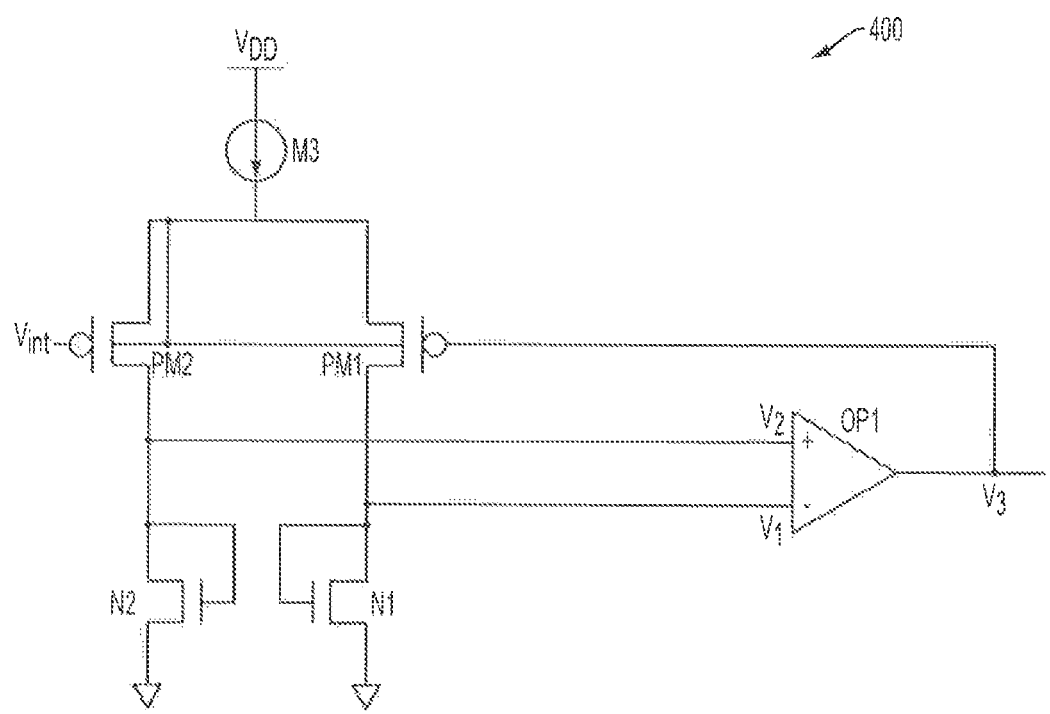
FIG. 4 is a diagram of a circuit used in conjunction with the circuit in FIG. 3 to generate a voltage, in accordance with a second embodiment.

FIG. 4 is a diagram of a circuit 400, in accordance with some embodiments. Circuit 400 is used in conjunction with circuit 300 in the same manner as circuit 200 is used in conjunction with circuit 300 to generate voltage Vref. Compared with circuit 200, PMOS transistors PM1 and PM2 correspond to NMOS transistors NM1 and NM2 in circuit 200, respectively. NMOS transistors N1 and N2 correspond to PMOS transistors P1 and P2 in circuit 200, respectively. Voltage V1 at the drain of transistor PM1 and voltage V2 at the drain of transistor PM2, however, are fed to the respective negative and positive terminals of amplifier OP2. For illustration, the threshold voltages of transistors PM1 and PM2 are called Vtpm1 (not labeled) and Vtpm2 (not labeled), respectively. Further, the absolute value |Vtpm1| of threshold voltage Vtpm1 is lower than the absolute value |Vtpm2| of threshold voltage Vtpm2. In other words, $$\Delta Vtp = |Vtpm2| - |Vtpm1|$$

Similar to circuit 200, voltage V3 and Vint in circuit 400 are fed to amplifier OP2 to result in the voltage Vref. In other words, Vref=(R4/R3)*$\Delta Vtp$, and is independent of PVT variations.

Figure 5:
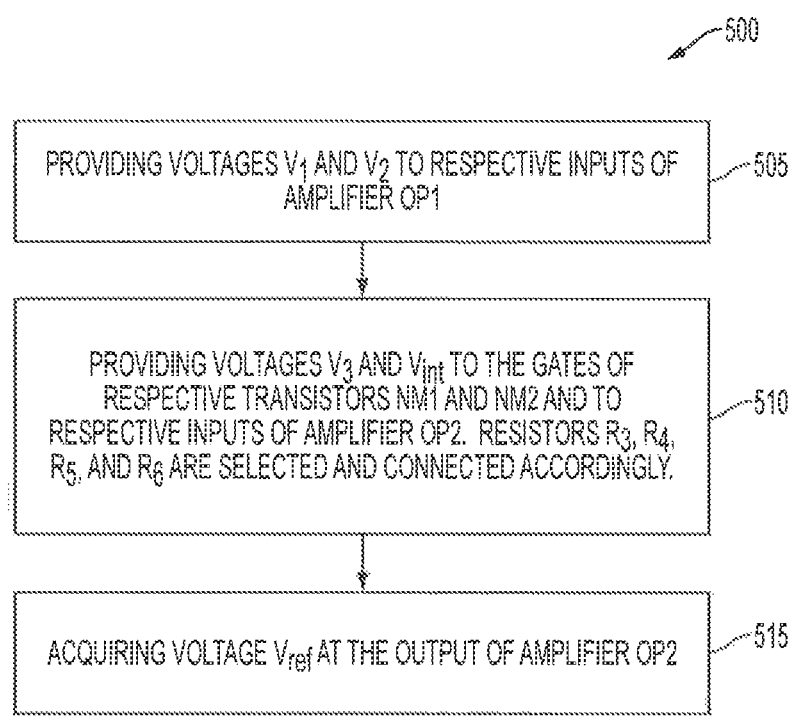
FIG. 5 is a flowchart of a method illustrating the operation of the circuit in FIGS. 1 and 3 working together, in accordance with some embodiments.

Other circuit elements shown in FIG. 1 can be adapted to be used with circuit 400 in the same manner as in circuit 200, and should be recognizable by persons of ordinary skill in the art after reviewing this document, Exemplary Method FIG. 5 is a flowchart of a method 500 illustrating an operation of circuit 200 working in conjunction with circuit 300, in accordance with some embodiments.

In step 505, voltages V1 and V2 are provided to respective inputs of amplifier OP1.

In step 510, voltage V3 and voltage Vint are provided to the gates of respective transistors NM1 and NM2, and to respective inputs of amplifier OP2 through respective resistors R3 and R5. Meanwhile, resistor R4 is coupled between the negative terminal and the output of amplifier OP2. Resistor R6 is coupled between the positive terminal of the amplifier OP2 and ground. In some embodiments, resistors R3, R4, R5, and R6 are selected such that (R4/R3)=(R6/R5).

In step 515, voltage Vref is acquired based on the above equation (1). That is, Vref=(R4/R3)*$\Delta Vtn$.

The operation of circuit 400 in conjunction with circuit 300 should be recognizable by persons of ordinary skill in the art based on the illustration of method 500.

A number of embodiments have been described. It will nevertheless be understood that various modifications may be made without departing from the spirit and scope of the disclosure. For example, the various transistors being shown as a particular dopant type (e.g., N-type or P-type metal oxide semiconductor (NMOS or PMOS)) are for illustration purposes. Embodiments of the disclosure are not limited to a particular type. Selecting different dopant types for a particular transistor is within the scope of various embodiments. The low or high logic level (Low or High) of the various signals used in the above description is also for illustration purposes. Various embodiments are not limited to a particular level when a signal is activated and/or deactivated. Selecting different levels is within the scope of various embodiments.

The various figures showing discrete resistors and capacitors are for illustration purposes. Equivalent circuitry may be used. For example, a resistive device, circuitry or network, e.g., a combination of resistors, resistive devices, circuitry, etc., can be used in place of a resistor. Similarly, a capacitive device, circuitry or network, e.g., a combination of capacitors, capacitive devices, circuitry, etc., can be used in place of a capacitor.

Some embodiments regard a circuit that comprises a first amplifier and a second amplifier. The first amplifier is configured to amplify a first voltage difference between a first voltage and a second voltage, and to generate a third voltage. The second amplifier is configured to amplify a second voltage difference between the third voltage and an input voltage, and to generate an output voltage. The first voltage is a voltage at a first terminal of a first transistor. The second voltage is a voltage at a second terminal of a second transistor. A first gate of the first transistor is adapted to receive the third voltage. A second gate of the second transistor is adapted to receive the input voltage. Threshold voltage values of the first transistor and the second transistor differ.

Some embodiments regard a circuit that comprises a first transistor, a second transistor, a first amplifier, and a second amplifier. The first transistor has a first terminal, a second terminal, a third terminal, and a first bulk. The second transistor has a fourth terminal, a fifth terminal, a sixth terminal, and a second bulk. A first threshold voltage value of the first transistors differs from a second threshold voltage value of the second transistor. The second terminal and the fifth terminal are coupled together and to a current path. The first amplifier has a first input, a second input, and a first output. The first terminal is coupled to the first input. The fourth terminal is coupled the second input. The third terminal is coupled to the first output. The sixth terminal is configured to receive a first voltage. The second amplifier has a third input, a fourth input, and a second output. The third input is configured to receive the first voltage through a first resistive device. The fourth input is electrically coupled to the first output through a second resistive device. The fourth input and the second output are electrically coupled together through a third resistive device. The third input is coupled to a first end of a fourth resistive device.

Some embodiments regard a method. In the method, a first voltage at a first terminal of a first transistor is provided to a first input of a first amplifier. A second voltage at a second terminal of a second transistor is provided to a second input of the first amplifier. A third voltage at a first output of the first amplifier is provided to a first gate of the first transistor. A fourth voltage is provided to a second gate of the second transistor and to a third input of a second amplifier through a first resistive device. The third voltage is provided to a fourth input of the second amplifier through a second resistive device. A fifth voltage is acquired at the second output of the second amplifier. A first end of a third resistive device, is coupled to the third input of the second amplifier. The fourth input of the second amplifier and the second output of the second amplifier are electrically coupled through a fourth resistive device. A first threshold voltage value of the first transistor is different from a second threshold voltage of the second transistor.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
 a first amplifier configured to amplify a first voltage difference between a first voltage and a second voltage, and to generate a third voltage; and
 a second amplifier configured to amplify a second voltage difference between the third voltage and an input voltage, and to generate an output voltage,
 wherein
 the first voltage is a voltage at a first terminal of a first transistor;
 the second voltage is a voltage at a second terminal of a second transistor;
 a first gate of the first transistor is adapted to receive the third voltage, the first terminal of the first transistor is a drain of the first transistor;
 a second gate of the second transistor is adapted to receive the input voltage, the second terminal of the second transistor is a drain of the second transistor; and
 threshold voltage values of the first transistor and the second transistor differ.

2. The circuit of claim 1, wherein a first bulk of the first transistor, a second bulk of the second transistor, a third terminal of the first transistor, and a fourth terminal of the second transistor are coupled together and coupled to a current path.

3. The circuit of claim 1, wherein the circuit is configured to meet at least one of the following conditions:
 the first transistor is configured such that a first bulk-source voltage drop between a first bulk and a first source of the first transistor is zero; and
 the second transistor is configured such that a second bulk-source voltage drop between a second bulk and a second source of the second transistor is zero.

4. The circuit of claim 1, further comprising a first load coupled to the first terminal of the first transistor and a second load coupled to the second terminal of the second transistor.

5. The circuit of claim 4, wherein the first load includes a first load transistor configured as a first diode and the second load includes a second load transistor configured as a second diode.

6. The circuit of claim 1, wherein
 the second amplifier is configured to receive the input voltage through a first resistive device, and to receive the third voltage through a second resistive device;
 a first input terminal of the second amplifier is electrically coupled to an output terminal of the second amplifier through a third resistive device;
 a second input terminal of the second amplifier is coupled to an end of a fourth resistive device.

7. A circuit comprising:
 a first transistor having a first terminal, a second terminal, a third terminal, and a first bulk, the third terminal being a gate of the first transistor, and the first terminal being a drain of the first transistor;
 a second transistor having a fourth terminal, a fifth terminal, a sixth terminal, and a second bulk, the sixth terminal being a gate of the second transistor, and the fourth terminal being a drain of the second transistor, a first threshold voltage value of the first transistor different from a second threshold voltage value of the second transistor, and the second terminal and the fifth terminal are coupled together and to a current path;
 a first amplifier having a first input, a second input, and a first output, the first terminal coupled to the first input, the fourth terminal coupled to the second input, the third terminal coupled to the first output, and the sixth terminal configured to receive a first voltage; and
 a second amplifier having a third input, a fourth input, and a second output, the third input configured to receive the first voltage through a first resistive device, the fourth input electrically coupled to the first output through a second resistive device, the fourth input electrically coupled to the second output through a third resistive device, and the third input coupled to a first end of a fourth resistive device.

8. The circuit of claim 7, wherein the first bulk and the second bulk are coupled together and coupled to the current path.

9. The circuit of claim 7, wherein the circuit is configured to meet at least one of the following conditions:
   a first bulk-source voltage drop between the first bulk and a first source of the first transistor is zero; and
   a second bulk-source voltage drop between the second bulk and a second source of the second transistor is zero.

10. The circuit of claim 7, further comprising a first load coupled to the first terminal and a second load coupled to the fourth terminal.

11. The circuit of claim 10, wherein the first load includes a third transistor configured as a first diode and the second load includes a fourth transistor configured as a second diode.

12. The circuit of claim 11, wherein
   the first transistor and the second transistor are NMOS transistors; and
   the third transistor and the fourth transistor are PMOS transistors.

13. The circuit of claim 11, wherein
   the first transistor and the second transistor are PMOS transistors; and
   the third transistor and the fourth transistor are NMOS transistors.

14. The circuit of claim 7, wherein a first ratio of a resistance of the third resistive device over a resistance of the second resistive device is equal to a second ratio of a resistance of the fourth resistive device over a resistance of the first resistive device.

15. The circuit of claim 7, further comprising a fifth resistive device and a sixth resistive device configured as a voltage divider to generate the first voltage.

16. The circuit of claim 15, further comprising a third transistor having a terminal coupled to a terminal of the sixth resistive device.

17. The circuit of claim 7, further comprising a third transistor having a terminal coupled to the first input of the first amplifier and a fourth transistor having a terminal coupled to the second input of the first amplifier.

18. A method comprising:
   providing a first voltage at a first terminal of a first transistor to a first input of a first amplifier, the first terminal being coupled to a first load, and the first terminal being a drain of the first transistor;
   providing a second voltage at a second terminal of a second transistor to a second input of the first amplifier, the second terminal being coupled to a second load, and the second terminal being a drain of the second transistor;
   providing a third voltage at a first output of the first amplifier to a first gate of the first transistor;
   providing a fourth voltage to a second gate of the second transistor, and to a third input of a second amplifier through a first resistive device;
   providing the third voltage to a fourth input of the second amplifier through a second resistive device; and
   acquiring a fifth voltage at a second output of the second amplifier,
   wherein
      a first end of a third resistive device is coupled to the third input of the second amplifier;
      the fourth input of the second amplifier and the second output of the second amplifier are electrically coupled through a fourth resistive device; and
      a first threshold voltage value of the first transistor is different from a second threshold voltage of the second transistor.

19. The method of claim 18, wherein the first load includes a third transistor configured as a first diode and the second load includes a fourth transistor configured as a second diode.

20. The method of claim 18, wherein a first ratio of a first resistance of the third resistive device over a second resistance of the first resistive device is equal to a second ratio of a third resistance of the fourth resistive device over a fourth resistance of the second resistive device.

* * * * *